United States Patent [19]

Nordholt et al.

[11] Patent Number: 4,607,234
[45] Date of Patent: Aug. 19, 1986

[54] GAIN-CONTROLLED AMPLIFIER ARRANGEMENT

[75] Inventors: Ernst H. Nordholt, Berkel en Rodenrijs; Hendrikus C. Nauta, Nootdorp, both of Netherlands

[73] Assignee: U.S. Philips Corporation, New York, N.Y.

[21] Appl. No.: 700,232

[22] Filed: Feb. 11, 1985

[30] Foreign Application Priority Data

Feb. 16, 1984 [NL] Netherlands .................. 8400495

[51] Int. Cl.[4] .............................................. H03G 3/20
[52] U.S. Cl. ...................................... 330/278; 330/254
[58] Field of Search ............... 330/254, 278, 280, 281, 330/285

[56] References Cited

FOREIGN PATENT DOCUMENTS 926759  5/1982  U.S.S.R. ............................. 330/254

Primary Examiner—Gene Wan
Attorney, Agent, or Firm—Thomas A. Briody; William J. Streeter; Marianne R. Rich

[57] ABSTRACT

Gain-controlled amplifier arrangement with a cascade arrangement of first and second gain-controlled amplifier stages, an AM-detection circuit and an integrating arrangement for generating a control voltage for the two stages and a threshold circuit for generating first and second threshold voltages, for delaying at an increasing input level the start of the control of the first stage (1-8) relative to that of the second stage (19-28). So as to prevent the gain control of the first stage from starting, for example because of an unwanted variation of the threshold voltages, before the gain control of the second stage has ended, the control ranges of the two stages are separated from each other by a separation area in which no gain control is effected. In order to prevent an unwanted deviation of the output level in that separation area the control voltage is generated by integration of a current in a capacitor (37), which current varies with the input level, so that this control does not only depend on the actual input level but also on the duration of occurrence of this input level.

5 Claims, 2 Drawing Figures

GAIN-CONTROLLED AMPLIFIER ARRANGEMENT

BACKGROUND OF THE INVENTION

1. Field of the Invention

The invention relates to a gain-controlled amplifier arrangement comprising a cascade arrangement of first and second gain-controlled amplifier stages, an AM-detection circuit and an integrating arrangement for generating a control voltage for the two stages, also comprising a threshold arrangement for generating first and second threshold voltages for delaying with an increasing input level the start of the control of the first stage relative to that of the second stage.

2. Description of the Prior Art

Such a gain-controlled amplifier arrangement is disclosed in U.S. Pat. No. 3,665,317.

The prior art amplifier arrangement produces an output signal whose amplitude is stabilized at a desired value, to a certain extent independent of the input signal level. To that end use is made of what is commonly referred to as delayed gain control. Therewith a maximum gain is effected for low input signal levels in the two stages and at an increasing input signal level first the gain of the last stage—i.e. the second stage—in the transmission path is reduced from a certain threshold level denoted the second threshold value hereinafter, followed by a gain reduction of the preceding,—i.e. first—stage when the input signal level exceeds a higher, so-called first threshold value. These threshold values are adjusted by means of the said threshold voltages such that the input signal level is adequately high upon reaching the respective threshold values to prevent a deterioration of the noise factor because of a gain reduction of the relevant stage from noticeably affecting the signal-to-noise ratio.

In the known amplifier arrangement deviations in the threshold voltages, caused, for example, by tolerance spread, temperature fluctuation or ageing not only cause an impermissible deviation of the output level but also an unwanted significant variation of the control rate and of the noise and distortion of the output signal in the control range. So it may, for example, happen that in a part of the overall control range both stages are simultaneously in a control state and together determine the control rate. It may also happen that the control range of the second stage in which an acceptable signal processing occurs is utilized over a too small part and the gain of the first stage is prematurely reduced, causing the noise contribution of the first stage to become undesirably great. It may further happen, that said control range of the second stage to be exceeded and consequently an impermissible signal distortion to be produced.

SUMMARY OF THE INVENTION

It is an object of the invention to obviate these disadvantages in a simple way.

According to the invention, a gain-controlled amplifier arrangement of the type set forth in the opening paragraph is characterized in that the AM-detection circuit produces a current which varies in dependence on the detected signal level, this current being applied to a capacitor of the integrating arrangement for generating the control voltage, which varies in dependence on an integration of the said current and is applied to control inputs of the two stages, the second stage being shunted by a signal shunting circuit and being blocked with an increasing signal level prior to the start of the control of the first stage.

When the present invention is used, the signal shunting circuit prevents the gain reduction in the second stage from becoming too large and consequently prevents the occurrence of distortion. In addition, the signal shunting circuit enables the second stage to be blocked entirely before the control of the first stage is started, which prevents the two stages from being simultaneously in a control state. An unwanted overlap between the control ranges of the two stages as a result of the above-mentioned threshold voltage deviations can be prevented in a simple way by choosing the first threshold voltage to be sufficiently far from the voltage value at which said blocking occurs.

In the so-called separating area thus produced no gain control is effected, so that there the output level varies with the input level. So as to keep the output level variations within acceptable limits it is possible to make this separating area as small as possible. However, the requirements as regards the permissible threshold voltage deviations then become considerably strict. To prevent this, use is made of a control voltage obtained by integration of a current which varies with the output level of the amplifier arrangement. Such a generation of a control voltage is known per se from the German Patent Specification No. 2855880. However, when combined with the rest of said characteristics in accordance with the invention, advantageous use is made of the fact that, more specifically in the last-mentioned separating area such a control voltage does not only depend on the actual input level but also on the duration of occurrence of this input level. The separating area is consequently also passed through when the input level further remains substantially constant. The time in which this separating area is passed through can be kept particularly short by a suitable dimensioning of the circuit, substantially independent of threshold voltage variations, without resulting in an overlap of the control ranges of the two stages.

A preferred embodiment of an amplifier arrangement according to the invention is characterized in that the signal shunting circuit comprises an amplifier stage having a fixed gain, the input thereof being coupled to the output of the first amplifier stage and the output thereof being coupled together with the output of the second stage to the AM-detection circuit.

Using this measure provides a freedom of choice as regards the dividing of the overall control range of the amplifier arrangement over the control ranges of the two stages.

A practical and simple realization of an amplifier arrangement according to the invention, in which the two amplifier stages each comprise an emitter-coupled pair of transistors with a signal current source in a common emitter lead whose input forms a signal input of the relevant stage, is characterized in that one of the base electrodes of the pair of transistors of each of the two stages is coupled to the integrating arrangement for applying the control voltage thereto, and the other base electrode of the pair of transistors of the first and second stages, respectively is coupled to an output of the threshold device for applying the first and second threshold voltage, respectively thereto, this signal current source of the second amplifier stage also applying an input signal to the signal shunting circuit.

A preferred embodiment in which the capacitor is prevented from being loaded is characterized in that at least one of the two stages comprises a further current mirror a control input of which is coupled to the collector of the controlled transistor of the pair of transistors, the current mirror producing the base current for the said controlled transistor.

A further preferred embodiment of such an amplifier arrangement is characterized in that the integrating arrangement comprises a voltage limiter for limiting the control voltage variations outside the control range.

The invention will now be further described by way of example with reference to the Figures shown in the accompanying drawing.

DESCRIPTION OF THE PREFERRED EMBODIMENTS

Figure 1:
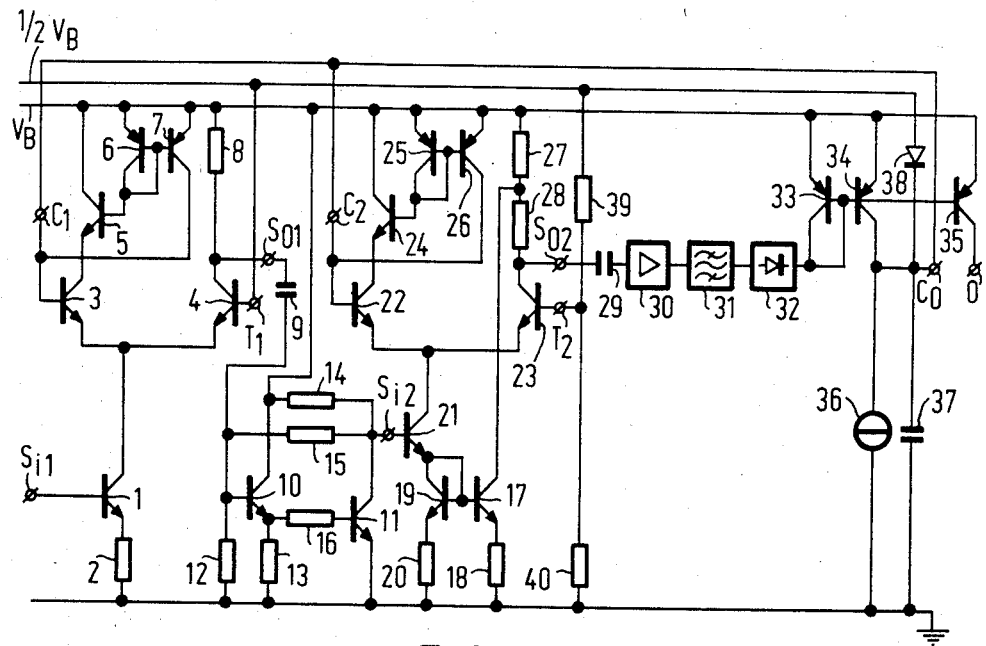
FIG. 1 shows a gain-controlled amplifier arrangement according to the invention.

FIG. 1 shows a gain-controlled amplifier arrangement according to the invention, comprising arranged sequentially in cascade between an IF-signal input $S_{i1}$ and an audio signal output O: a first gain-controlled amplifier stage 1-8 having the IF-signal input $S_{i1}$ as a signal input, a signal output $S_{o1}$, a control voltage input $C_1$ and a threshold voltage input $T_1$; via a coupling capacitor 9 a linear negative feedback buffer amplifier 10-21 comprising first and second current output stages 19-21 and 17-18, respectively, the second current output stage 17, 18 serving as a signal shunting circuit; a second gain-controlled amplifier stage 19-28, which comprises the first current output stage 19-21 of the buffer amplifier 10-21 and has a signal input $S_{i2}$, a signal output $S_{o2}$, a control voltage input $C_2$ and a threshold input voltage $T_2$, via a coupling capacitor 29 a further linear buffer amplifier 30; an IF-bandpass filter 31 for selection of the gain-controlled AM-IF signal; an AM-dectection circuit 32 for amplitude detection of the AM-IF signal, whose output current is applied to a current mirror 33-35. A first output of the current mirror 33-35 is coupled to an integrating arrangement 36-38 for supplying a gain control voltage—designated control voltage for short—which is connected to the respective control voltage inputs $C_1$ and $C_2$ of said stages 1-8 and 19-28 via a control voltage output $C_0$. A second output of the current mirror 33-35 is coupled to the audio-output O of the amplifier arrangement. The amplifier arrangement also comprises a threshold circuit comprising a circuit (not shown) for generating a stabilized voltage ($\frac{1}{2}V_B$), which is equal to half the supply voltage ($V_B$), a connection from the threshold voltage input $T_1$ to this stabilized voltage ($\frac{1}{2}V_B$) for applying a first threshold voltage thereto and a voltage divider 39, 40 arranged between the stabilized voltage ($\frac{1}{2}V_B$) and ground, whose output is connected to the threshold voltage input $T_2$ for applying a second threshold voltage thereto.

The two amplifier stages 1-8 and 19-28 each comprise a so-called "long-tail pair" controlled amplifier, comprising an emitter-coupled pair of transistors 3, 4 and 22, 23 respectively, whose intercoupled emitters are connected to a signal source 1, 2; 19-21 which is controlled via the signal input $S_{i1}$, $S_{i2}$ and will be described in greater detail hereinafter. The control voltage input $C_1$, $C_2$ is connected to the base of one transistor 3, 22; the threshold voltage input $T_1$, $T_2$ is connected to the base of the other transistor 4, 23 of the pair of transistors 3, 4; 22, 23 and the signal output $S_{o1}$, $S_{o2}$ is connected to the collector of the other transistor 4, 23, whose colletor is coupled to the supply voltage $V_B$ via a collector resistor 8 and collector resistors 27, 28, respectively. In a manner which is known per se the base differential voltage of the pair of transistors 3, 4; 22, 23 determines the ratio in which the signal current of the signal current source 1, 2; 19-21 is divided over the two transistors 3, 4 and 22, 23, respectively and consequently the gain of the relevant stage 1-8, 19-28.

The collector of said one transistor 3, 22 of the pair of transistors 3, 4; 22, 23 is also connected to the supply voltage $V_B$ via the emitter-collector path of a transistor 5, 24. The base of this transistor 5, 24 which carries the same current as the base of the transistor 3, 22 is connected to the input of a so-called further current mirror 6, 7; 25, 26, in which this base current is "mirror" and applied to the base of the transistor 3, 22 via an output. The base current compensation thus obtained prevents a control-dependent affecting of the control voltage at the control voltage input $C_1$, $C_2$.

The signal current source 1, 2 of the first stage 1-8 comprises a transistor 1 whose base is connected to the IF-signal input $S_{i1}$, the collector to the intercoupled emitters of the pair of transistors 3, 4 and the emitter to ground via an emitter resistor 2. The transistor 1 realizes a linear voltage-current conversion at a suitably chosen value of the emitter resistor 2.

The signal current source of the second stage 19-28 is formed by the first current output stage 19-21 of the buffer amplifier 10-21. The buffer amplifier 10-21 has a low-resistive input impedance and realizes a linear current gain. To that end it is negatively fed back to a very high extent and comprises a transistor 10 whose base is connected to the signal output $S_{o1}$ of the first stage 1-8 via the coupling capacitor 9 and to ground via a base resistor 12, the emitter of this transistor being connected to ground via an emitter resistor 13 and to the base of a grounded-emitter transistor 11 via a resistor 16. The collector of this transistor 11 is connected on the one hand to the first current output stage 19-21 via the signal input $S_{i2}$ of the second stage 19-28 and on the other hand to the supply voltage $V_B$ via a collector resistor 14. Said collector of the transistor 11 is negatively fed back to the base of the transistor 10 via a resistor 15. The first current output stage 19-21 comprises a transistor 21 whose base is coupled to said signal input $S_{i2}$, the collector to the coupled emitters of the pair of transistors 22, 23 and the emitter to ground via the collector-emitter path of a diode-connected transistor 19 and an emitter resistor 20. The base-emitter diode of the transistor 19 compensates the transistor 21 for temperature fluctuations.

The current gain of the buffer amplifier 10-21 from the base input of the transistor 10 to the collector output of the transistor 21 is determined to a considerable extent by the resistor 15 and is preferably chosen such that it just compensates for the maximum signal attenuation in the pair of transistors 22, 23, which means that when this maximum signal attenuation is, for example −40 dB, said current gain is chosen to be 40 dB.

The second current output stage 17, 18 of the buffer amplifier 10-21 comprises a transistor 17, which is connected by means of its base to said transistor 19 and forms a current mirror therewith. The emitter of the transistor 17 is coupled to ground via an emitter resistor 18 and the collector to the junction point between the collector resistors 27 and 28 of the transistor 23. By means of a suitably chosen resistance ratio between the emitter resistors 18 and 20 the output current of this second current output stage 17, 18, applied to said junction is adjusted to a desired fraction (for example 0.1) of the output current of the first current output stage 19-21 being applied to the intercoupled emitters of the pair of transistors 22, 23. This output current of the second current output stage 17, 18 which, as described in the foregoing, functions as a current shunting circuit determines the lower limit of the output current at the signal output $S_{o2}$ of the second stage 19-28.

The last-mentioned output current is amplified via the coupling capacitor 29 in the buffer amplifier 30, which may have the same configuration as the circuit 10-16, 19-21 of the buffer amplifier 10-21, and is amplitude-detected after selection in the IF-bandpass filter 31 in the AM-detection circuit 32. The AM-detection circuit 32 may have a structure which is known per se, for example as described in the book "Analysis and Design of Analog Integrated Circuits", by P. R. Gray and R. G. Meyer, published by Wiley in 1977.

The output current of the AM-detection circuit 32, which contains the desired AM-information thereafter flows through the collector-emitter path of an input transistor 33 of the current mirror 33-35. The input transistor 33 is short-circuited across its collector-base diode and base-coupled to two output transistors 34 and 35. The emitters of the transistors 33-35 are connected to the supply voltage $V_B$ whilst the collectors of the output transistors 34 and 35, are coupled to the integrating arrangement 36-38 and to the audio-output O of the amplifier arrangement respectively. In a practical embodiment the collector currents of said output transistors 34 and 35 are chosen to be respectively equal to 5 and 1 times the output current of the AM-detection circuit 32.

The integrating arrangement 36-38 comprises a capacitor 37 arranged between the collector of the output transistor 34 of the current mirror 33-35 and ground, and which is coupled to the control voltage output $C_0$ across which the desired gain control voltage is formed. A discharge path which is connected parallel to the capacitor 37 includes a constant current source 36 whose current constitutes a current reference level for the collector current of said output transistor 34. An increase in the capacitor voltage does not take place before said collector current exceeds the current reference level. The increase continues as long as the collector current is higher than this current reference level, so that the capacitor voltage depends on both the amount by which the collector current exceeds the current reference level and the duration for which the level is exceeded. The capacitor 37 is also connected via a diode 38 to the stabilized voltage $\frac{1}{2}V_B$, which diode 38 functions as a voltage limiter, so that when said collector current decreases to below the current reference level, the capacitor or control voltage at the control voltage output $C_0$ is prevented from decreasing further than the diode forward voltage below this stabilized voltage $\frac{1}{2}V_B$, denoted as the limit value of the control voltage hereinafter.

With a low input level, that is to say for input signals having a small amplitude, the control voltage has the above-mentioned limit value which is so much lower than the first and second threshold voltages and the threshold voltage inputs $T_1$ and $T_2$ that the respective transistors 3 and 22 are cut off and the currents from the current sources 1, 2 and 19-21 fully pass the transistors 4 and 23. The two stages 1-8 and 19-28 then provide a maximum gain from signal input $S_{i1}$, $S_{i2}$ to signal output $S_{o1}$, $S_{o2}$.

At an increase of this input level also the output current of the current mirror 33-35 at the collector of the output transistor 34 increases and after the current reference level determined by the current of the constant current source 36 has been exceeded, the last-mentioned output current will charge the capacitor 37, as long as the current reference level is exceeded. As a result thereof the capacitor voltage increases from the said limit value and consequently also the control voltage at the control inputs $C_1$ and $C_2$. The second threshold voltage at the threshold voltage input $T_2$ is less than the first threshold voltage at the threshold voltage input $T_1$, so that at said increase of the control voltage first the second threshold voltage is exceeded and the gain of the second stage 19-28 is reduced, whilst the first stage 1-8 maintains a maximum gain. At a further increase of the control voltage the gain of the second stage 19-28 decreases further, until this stage is cut off, in which situation the current from the current source 19-21 passes substantially fully the transistor 22, the transistor 23 is rendered non-conductive and the gain control of this second stage 19-28 is ended. The ouput signal amplitude at the signal output $S_{o2}$ is then determined by the non-controlled output current of the signal shunting circuit 17-18 and the values of the collector resistors 27 and 28.

The non-controlled component thus produced in the output signal at the signal output $S_{o2}$ is preferably chosen such that the gain reduction in the second stage 19-28 at the instant at which this non-controlled component predominantly determines the amplitude of said output signal is still sufficiently small to prevent the buffer amplifier 10-21 from being overdriven in order to maintain the worked signal output level at $S_{o2}$.

At a further increase of the control voltage, the so-called separating area between the control ranges of the two stages is passed through, which separating area must be sufficiently large to prevent overlap between the last-mentioned control ranges because of threshold voltage deviations caused by, for example, tolerance spread, ambient factors and ageing. However, no gain control is effected in this separating area. As the increase in the control voltage is not caused by an increase in the input level only but is also determined by the duration of occurrence of this input level, the lack of a gain control in this separating area has no noticeable influence on the output level if particularly the integrating circuit is dimensioned properly.

After the first threshold voltage has been exceeded, at a further increase of the control voltage a gain reduction of the first stage 1-8 occurs in the same way as described in the foregoing for the second stage 19-28. Since the first stage 1-8 is not shunted, the gain reduction can in principle be continued until this first stage 1-8 is cut off. In practice this is not attained and the limit of the control range of the first stage 1-8 is determined by that value of the input signal level at which the preceding stages, not shown, are clipped.

At a decrease of the input level the control voltage does not decrease until the current of the current mirror 33-35 at the collector of the output transistor 34 falls short of the current reference level and the capacitor 37 is discharged. As will be obvious, a decreasing control voltage causes a delayed gain increase, first the gain of the first amplifier stage 1-8 increasing to its maximum value, followed, after the separating area has been passed, by an increase in the gain of the second amplifier stage 19-28.

The decrease in the control voltage is limited by the diode 38 to prevent a control delay owing to an excessive charging time of the capacitor 37.

In a practical embodiment the components used had the following values.

| Resistors | Value | Capacitor | Value (F) | Current source | Current (mA) |
|---|---|---|---|---|---|
| 2 | 680 | 9 | 30 p | 36 | 0,3 |
| 8 | 1K1 | 29 | 30 p | | |
| 12 | 47K | 37 | 22μ | | |
| 13 | 5K6 | | | | |
| 14 | 4K | | | | |
| 15 | 22K | | | | |
| 16 | 180 | | | | |
| 20 | 180 | | | | |
| 18 | 2K2 | | | | |
| 27 | 100 | | | | |
| 28 | 1K | | | | |
| 39 | 150 | | | | |
| 40 | 4K | | | | |

Figure 2:
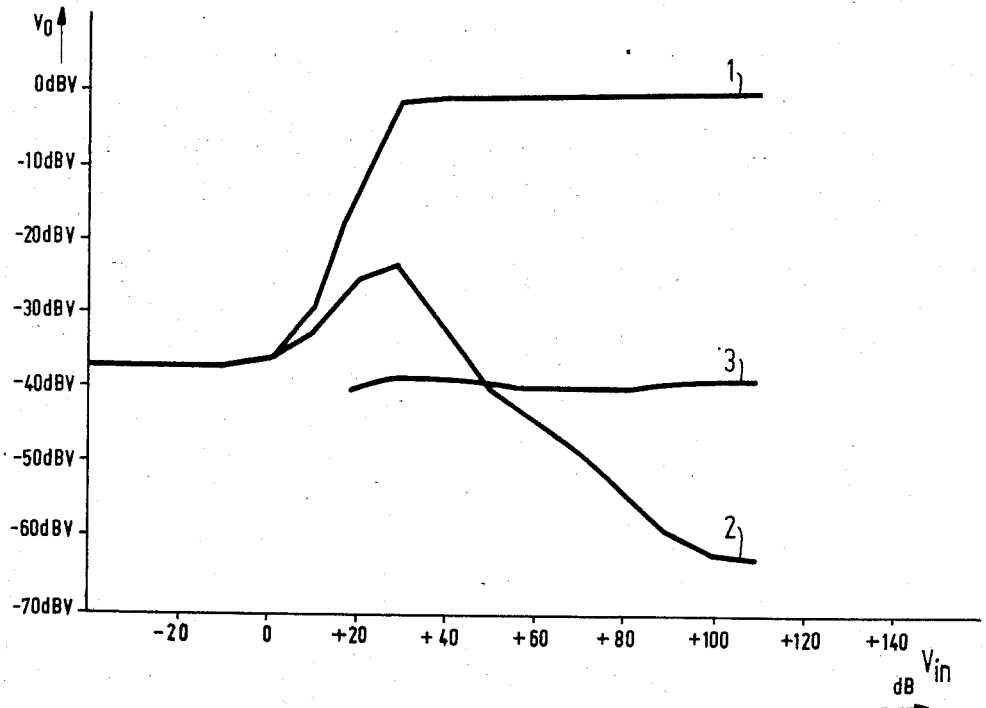
FIG. 2 illustrates some characteristics which represent the variation of the output level, the noise and the $2^{nd}$-order harmonic distortion as a function of the input level.

The diagram of FIG. 2 shows for a 400 Hz-test signal, which is amplitude-modulated on a 10.7 MHz carrier with a modulation depth of 30%, as a function of the input level ($V_{in}$), the variation of the output level ($V_o$) by means of curve 1, the variation of the noise level measured in a 2.5 kHz bandwidth by means of curve 2 and by means of curve 3 the variation of the $2^{nd}$-order harmonic distortion of a practical embodiment of the amplifier arrangement of FIG. 1.

In the control range of the amplifier arrangement (approximately from 30 to 110 dB), the output level (curve 1) hardly deviates from the stabilization value (0 dB), the noise (curve 2) noticeably decreases with an increasing gain reduction and the $2^{nd}$-order harmonic distortion (curve 3) remains substantially constant.

It is obvious that the invention is not limited to the embodient shown and described. To apply the inventive idea it is, for example, not necessary to relate the gain of the buffer amplifier 10-21 to the maximum gain reduction of the second stage, the buffer amplifier 10-21 may optionally be replaced by two fixed, parallel amplifier stages one of which produces the input signal for the said second stage and the other functioning as a signal shunting circuit (which other stage may have a gain equal to unity and can then be replaced by a connecting line) and/or alternative circuits which will be obvious for a person skilled in the art can be used as the first and second controlled amplifier stages and the integrating arrangement.

What is claimed is:

1. In gain-controlled amplifier apparatus having a first gain-controlled amplifier stage having a first control input, a first signal input and a first signal output, a second gain-controlled amplifier stage connected in cascade to said first gain-controlled amplifier stage, said second gain-controlled amplifier stage having a second control input, a second signal input and a second signal output, the improvement comprising:

AM detector means connected to said second gain-controlled amplifier stage for detecting the AM component of a signal applied thereto and producing an output current varying in dependence thereon;

integrator means connected to said AM detector means for receiving and integrating said output current and generating a control voltage varying in dependence on the so-integrated current;

means applying said control voltage to said first and second control input so that said second gain controlled amplifier stage is blocked for increasing values of said output current prior to control of said first gain controlled amplifier stage in response to said control signal applied to said first control input; and signal shunting means interconnected between said first output and said AM detector means for shunting signals from said first output to said AM detector means when said second gain-controlled amplifier stage is blocked.

2. Gain-controlled amplifier means as claimed in claim 1, wherein said signal shunting means comprises a fixed gain amplifier stage having an input coupled to said first output and having an output coupled to said AM detector means.

3. Gain-controlled amplifier means as claimed in claim 2, wherein each of said first and second gain-controlled amplifier stages comprises an emitter-coupled pair of transistors having a signal current source in a common emitter lead, each of said pair of transistors having a first base electrode coupled to said integrating means for receiving said control voltage, and a second base electrode, and threshold circuit means connected to each of said second electrodes for applying a first and second threshold voltage thereto, said first and second threshold voltages delaying control of said first gain-controlled amplifier stage until blocking of said second gain-controlled amplifier stage.

4. Gain-controlled amplifier means as claimed in claim 3, wherein at least a selected one of said first and second gain-controlled stages further comprises a current mirror stage, having a control input connected to one transistor of said pair of transistors, said current mirror stage producing base current for said transistor.

5. Gain-controlled amplifier means as claimed in claim 1, wherein said integrating means comprises voltage limiting means.

* * * * *